United States Patent
Marier

(10) Patent No.: US 10,274,591 B2
(45) Date of Patent: Apr. 30, 2019

(54) MOTOR VEHICLE ULTRASONIC TRANSDUCER FOR DISTANCE MEASUREMENT, CORRESPONDING MANUFACTURING METHOD AND USE

(71) Applicant: VALEO EQUIPEMENTS ELECTRIQUES MOTEUR, Creteil (FR)

(72) Inventor: Nicolas Marier, Fresnes sur Marne (FR)

(73) Assignee: Valeo Equipments Electriques Moteur, Creteil (FR)

( * ) Notice: Subject to any disclaimer, the term of this patent is extended or adjusted under 35 U.S.C. 154(b) by 216 days.

(21) Appl. No.: 15/511,347

(22) PCT Filed: Jul. 23, 2015

(86) PCT No.: PCT/FR2015/052044
§ 371 (c)(1),
(2) Date: Mar. 15, 2017

(87) PCT Pub. No.: WO2016/042223
PCT Pub. Date: Mar. 24, 2016

(65) Prior Publication Data
US 2017/0254885 A1 Sep. 7, 2017

(30) Foreign Application Priority Data
Sep. 15, 2014 (FR) ..................................... 14 58665

(51) Int. Cl.
*G01S 7/521* (2006.01)
*G01S 15/08* (2006.01)
(Continued)

(52) U.S. Cl.
CPC .............. *G01S 7/521* (2013.01); *G01S 15/08* (2013.01); *G01S 15/931* (2013.01);
(Continued)

(58) Field of Classification Search
CPC ........ G01S 7/521; G01S 15/08; G01S 15/931; G01S 2015/932; H05K 3/4644;
(Continued)

(56) References Cited

U.S. PATENT DOCUMENTS

2007/0277615 A1 12/2007 Triebl et al.
2010/0300207 A1 12/2010 Ding et al.
(Continued)

FOREIGN PATENT DOCUMENTS

CN 107155354 A * 9/2017 ............... H05K 1/09
EP 2757812 A1 7/2014
(Continued)

*Primary Examiner* — Daniel Pihulic
(74) *Attorney, Agent, or Firm* — Berenato & White, LLC

(57) ABSTRACT

The invention relates to an ultrasonic transducer (10) of the type comprising a housing (16) provided with an electrical connector (17), at least one ultrasonic transducer (15) and an electronic card (13) for controlling the transducer and which is arranged inside the housing and consists of a printed circuit board (14) on which active components (11) and passive components (12) are mounted. According to the invention, the active components include integrated active components (11) which are completely embedded in a substrate of the printed circuit board and the passive components include integrated passive components (12) which are completely embedded in the substrate. According to another feature, the active components and the passive components include surface-mounted components (7) arranged solely on one side of the printed circuit board and the transducer is mounted on an opposite side.

17 Claims, 3 Drawing Sheets

(51) Int. Cl.
  *G01S 15/93* (2006.01)
  *H05K 1/18* (2006.01)
  *H05K 3/22* (2006.01)
  *H05K 3/46* (2006.01)
  *H05K 3/00* (2006.01)
  *H05K 3/40* (2006.01)
  *H05K 1/09* (2006.01)
  *G10K 11/00* (2006.01)

(52) U.S. Cl.
  CPC ............ *G10K 11/004* (2013.01); *H05K 1/09* (2013.01); *H05K 1/185* (2013.01); *H05K 1/188* (2013.01); *H05K 3/0032* (2013.01); *H05K 3/0047* (2013.01); *H05K 3/22* (2013.01); *H05K 3/4038* (2013.01); *H05K 3/4644* (2013.01); *G01S 2015/932* (2013.01); *H05K 2201/10151* (2013.01); *H05K 2203/107* (2013.01); *H05K 2203/1316* (2013.01); *H05K 2203/1327* (2013.01)

(58) Field of Classification Search
  CPC ...... H05K 3/22; H05K 3/0047; H05K 3/0032; H05K 1/185; H05K 3/4038; H05K 1/09; H05K 1/188; H05K 2203/107; H05K 2201/10151; H05K 2203/1316; H05K 2203/1327; G10K 11/004
  See application file for complete search history.

(56) References Cited

U.S. PATENT DOCUMENTS

2013/0193533 A1     8/2013  Vos et al.
2017/0254885 A1*    9/2017  Marier .................... H05K 1/09

FOREIGN PATENT DOCUMENTS

| EP | 3195005 A1 * | 7/2017 | ............... H05K 1/09 |
| FR | 3025879 A1 * | 3/2016 | ............... H05K 1/09 |
| FR | 3025879 B1 * | 3/2018 | ............... H05K 1/09 |
| WO | WO-2016042223 A1 * | 3/2016 | ............... H05K 1/09 |

* cited by examiner

MOTOR VEHICLE ULTRASONIC TRANSDUCER FOR DISTANCE MEASUREMENT, CORRESPONDING MANUFACTURING METHOD AND USE

CROSS-REFERENCE TO RELATED APPLICATIONS AND CLAIM TO PRIORITY

This application is a national stage application of International Application No. PCT/FR2015/052044 filed Jul. 23, 2015, which claims priority to French Patent Application No. 1458665 filed Sept. 15, 2014, the disclosures of which are incorporated herein by reference and to which priority is claimed.

FIELD OF THE INVENTION

The present invention relates to a motor vehicle ultrasonic transducer for distance measurement and its manufacturing method.

It also relates to the use of this ultrasonic transducer in a motor vehicle.

BACKGROUND OF THE INVENTION

There exist numerous versions of ultrasonic transducers for use in motor vehicles.

These applications have for example the aim of assisting the driver of a motor vehicle in parking operations by measuring the distance to a possible obstacle. For this purpose, ultrasonic transducers comprise an ultrasonic membrane by means of which ultrasonic signals are emitted and received in turn. This transducer together with an electronic card equipped with the necessary electronics is located in a housing, which is arranged for example in a bumper of the vehicle. The housing has a coupling for electrical connection to the onboard power supply network and a data bus.

Such an ultrasonic transducer is described particularly in American Patent Application US20070277615 under the name of the VALEO SCHALTER UND SENSOREN company.

Technology of the electronic card of this transducer is that of a printed circuit board with active and passive components mounted on the surface. Due to the presence of components on the two faces of the printed circuit board, the transducer must be mounted on a support over the components.

This results in a significant height and less impact resistance.

Therefore there is a need for a flatter and more robust ultrasonic transducer which can be easily integrated in motor vehicles, and particularly in bumpers.

SUMMARY OF THE INVENTION

The present invention thus aims at satisfying this need with a motor vehicle ultrasonic transducer for distance measurement of the type comprising:
 a housing provided with an electrical connector;
 at least one ultrasonic transducer;
 an electronic card for controlling this ultrasonic transducer arranged inside the housing and consisting of a printed circuit board on which the active components and the passive components are mounted.

According to the invention, the active components include integrated active components completely embedded in a substrate of the printed circuit board and the passive components include integrated passive components also completely embedded in this substrate and the active components and the passive components include surface-mounted components arranged solely on one side of the printed circuit board and the transducer is mounted on an opposite side.

According to another feature of the invention, the integrated active components and the integrated passive components include copper pads connected by microvias to copper tracks of the printed circuit board.

According to yet another feature of the invention, the integrated active components include at least one bare silicon chip.

In the ultrasonic transducer according to the invention, this chip is an ASIC.

According to yet another feature of the invention, in the ultrasonic transducer, the ultrasonic membrane consists of a piezoelectric sensor.

According to another aspect, the invention relates to a method of manufacturing the motor vehicle ultrasonic transducers for distance measurement described above, which includes a general step for producing an electronic card comprising a printed circuit board and electronic components.

This general step according to the invention comprises:
 a preliminary step of pre-treating at least one of the electronic components subsequently forming at least one integrated component embedded in the printed circuit;
 a first step of laser drilling reference marks on copper layers subsequently forming part of this printed circuit board;
 a second step of printing at least one of the copper layers with a dielectric material;
 a third step of placing the integrated component on the dielectric material;
 a fourth step of stacking and pressing the copper layers and organic substrate layers comprising at least one recess to receive this integrated component;
 a fifth step of laser drilling;
 a sixth step of mechanical drilling;
 a seventh step of purification;
 an eighth step of metallization to form vias and microvias comprising a first phase of imaging, a second phase of copper deposition and a third phase of stripping and etching;
 an ninth step of automatic inspection;
 a downstream step of treating this organic substrate.

The general step of manufacturing the ultrasonic transducer according to the invention moreover comprises a first additional step of arranging solely on a first side of the printed circuit board at least one of the electronic components of the surface-mounted component type.

According to the invention, the general step moreover comprises a second additional step of affixing at least one piezoelectric sensor to a second side opposite the first side and of coupling this piezoelectric sensor to the corresponding microvias by flexible connecting wires.

The motor vehicle ultrasonic transducer for distance measurement according to the invention is advantageously used in a system to assist parking or emergency braking.

These few essential specifications will have rendered the advantages provided by this motor vehicle ultrasonic transducer obvious to the person skilled in the art compared to the prior art.

The detailed specifications of the invention are given in the description below in conjunction with the appended

DETAILED DESCRIPTION OF A PREFERRED EMBODIMENT(S)

Figure 1:
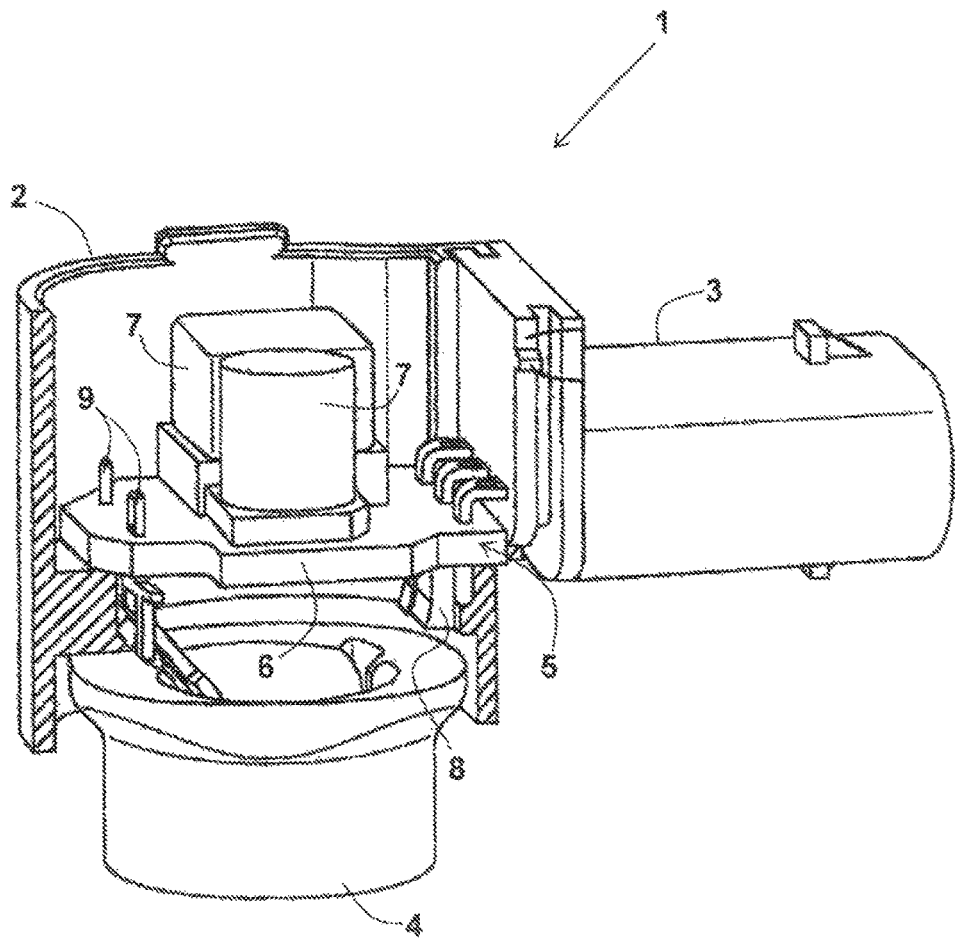
FIG. 1 shows the motor vehicle ultrasonic transducer known from the state of the art.

The type of ultrasonic transducer concerned by the preferred embodiment of the invention is shown on FIG. 1.

In a conventional manner, this ultrasonic transducer 1, intended to be fitted in a motor vehicle bumper, comprises a housing 2 and an electrical connector 3 protecting an ultrasonic transducer 4, which in this example is a membrane transducer.

An electronic card 5, consisting of a printed circuit board supporting surface-mounted components (SMC) 7, controls the membrane transducer 4 for emitting and receiving ultrasonic signals after reflection from a possible obstacle within a radius of a few metres.

Also in a conventional manner the distance between this obstacle and ultrasonic transducer 1 is calculated by electronic card 5 based on the time for these signals to be sent and returned.

In this transducer 1 known from the state of the art, traditionally manufactured printed circuit board 6 is double-sided, i.e. it has two copper layers separated by an insulating substrate.

Passive SMC components 7 (resistors, capacitors, inductors . . . ) and the active components, such as particularly an ASIC (English acronym for "Application Specific Integrated Circuit") are mounted on the two faces of printed circuit board 6, and prevent membrane transducer 4 from being directly mounted on printed circuit board 6.

Membrane transducer 4 is mounted in electronic card 5 on a support 8 and is connected to printed circuit board 5 by through pins 9.

This standard assembly has the disadvantage of being cumbersome and not very reliable, especially if ultrasonic transducer 1 is integrated in the bumper of the vehicle, which, by definition, is subjected to impacts.

Figure 2:
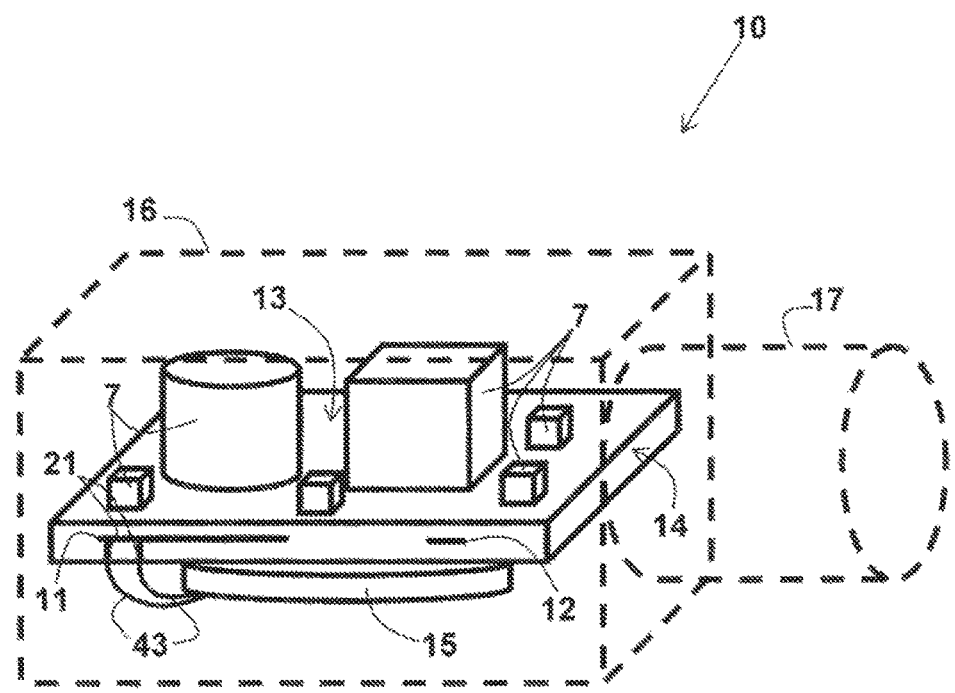
FIG. 2 schematically shows a motor vehicle ultrasonic transducer according to the invention.

In ultrasonic transducer 10 according to the invention shown schematically on FIG. 2, the embedding of some active 11 and passive 12 components of components 7 of electronic card 13 in printed circuit board 14 enables a side opposite the side where SMC components 7 are mounted to be exposed in order to mount the ultrasonic transducer, which here is a piezoelectric sensor 15.

In this way housing 16 of ultrasonic transducer 10 according to the invention and electrical connector 17 form a compact unit flatter than conventional ultrasonic transducer 1.

This housing 16 and this connector 17 are fabricated by plastic injection moulding in a conventional manner.

Figure 3:
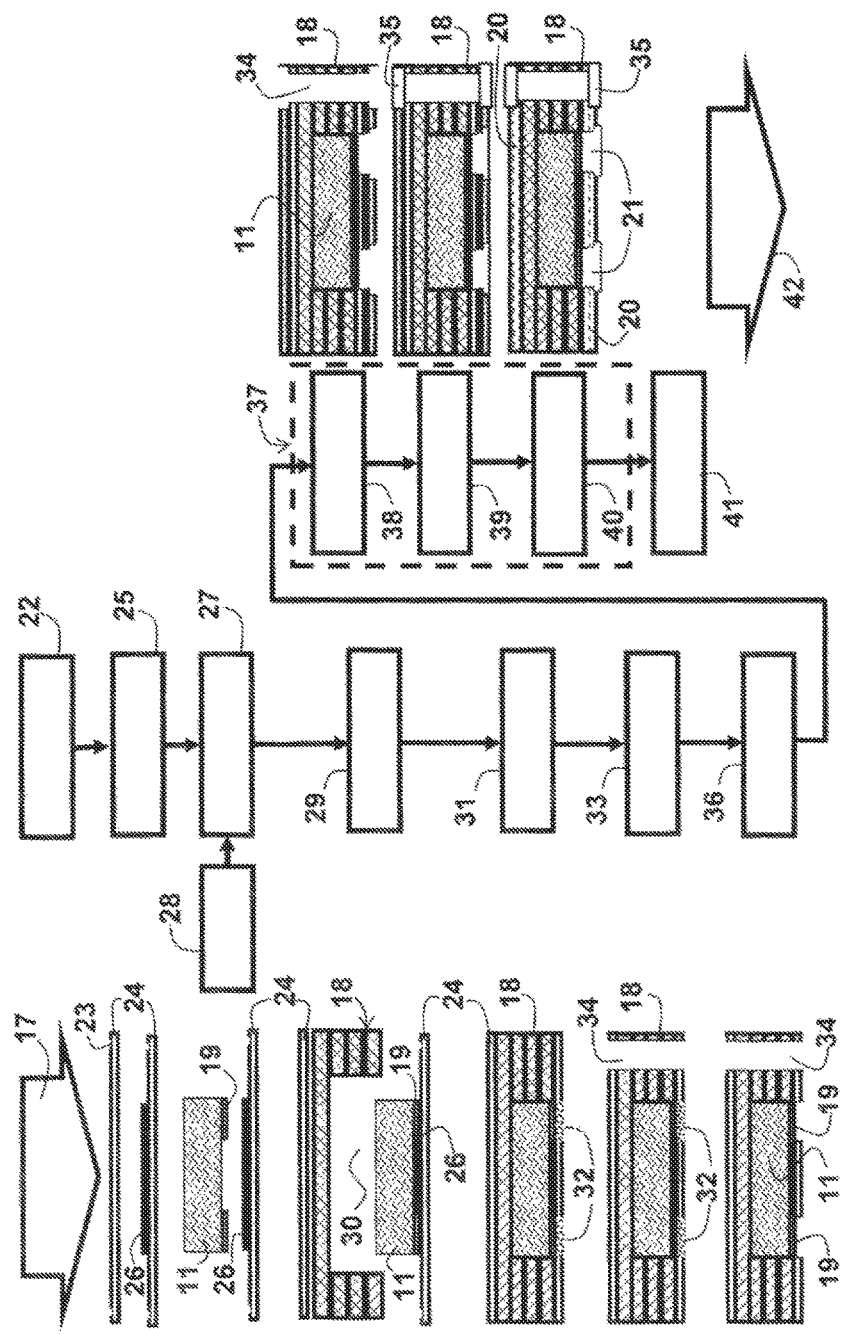
FIG. 3 illustrates the method according to the invention of manufacturing an electronic card for the ultrasonic transducer shown on FIG. 2, particularly for the printed circuit board.

The ultrasonic transducer according to the invention is produced by assembling with the housing 16 electronic card 13 formed during a general step illustrated on FIG. 3.

In a preliminary step 17, electronic components 11, 12 intended to be embedded in an organic substrate 18 of printed circuit board 14 are subjected to a particular treatment.

Active components 11 are integrated in printed circuit board 14 in the shape of a bare semiconductor chip 11 (generally made of silicon). The particular treatment of chips 11 is carried out on the whole wafer in order to produce a copper redistribution layer 19 which will enable the interconnections with tracks 20 of printed circuit board 14 to be achieved by means of metallized microvias 21. This treatment is carried out in a clean room.

Redistribution layer 19 is routed under consideration of the necessary insulation distances between the signals to avoid electromigration problems and also to allow the addition of copper zones facilitating the heat dissipation of chip 11 towards substrate 18.

In a particular embodiment of the invention, only one chip 11 of the ASIC type which fulfils all the emission-reception functions of ultrasonic transducer 10 is integrated in organic substrate 18.

With regard to passive components 12 (resistors, capacitors, inductors . . . ) intended to be embedded in organic substrate 18 of printed circuit board 14, these are in the same way provided with copper pads 19.

In a first step 22 of laser drilling reference marks 23 are produced on copper layers 24 which will subsequently form part of printed circuit board 14.

In a second step 25, these copper layers 24 are printed with a dielectric material 26 in order to insulate embedded components 11, 12 outside zones of connections 19.

In a third step 27, components 28 intended to be embedded are placed on printed dielectric material 26. The operation consisting of affixing a chip 11 on a copper layer 24 is also carried out in a clean room.

In a fourth step 29, copper layers 24 and organic substrate layers 18 in which recesses 30 have been provided to receive embedded components 11, 12, are stacked.

In a fifth step 31, copper layers 24 and dielectric material 26 opposite zones of connections 19 of embedded components 11, 12 are laser drilled so as to strip these 32 for subsequent formation of metallized microvias 21.

In a sixth step 33, holes 34 are mechanically drilled in the copper layers and the layers of substrate 18 for subsequent formation of metallized vias 35.

In a seventh step 36, impurities 32 resulting from the laser drilling during fifth step 31 are eliminated.

In an eighth step 37 of metallization microvias 21 and vias 35 are produced during a first phase 38 of imaging, a second phase 39 of copper deposition and a third phase 40 of stripping and etching.

A ninth step 41 of automatic inspection by means of industrial sensing enables the conformity of printed circuit board 14 with a reference model to be checked.

A downstream step 42 involves a treatment of organic substrate 18 and finishing of printed circuit board 14.

In a first additional step (not-illustrated), electronic card 13 is equipped with surface-mounted active and passive components 7 solely on a first side of printed circuit board 14.

This measure allows a second side opposite the first side to be exposed for affixing piezoelectric sensor 15 in a second additional step.

During this second additional step, piezoelectric sensor 15 is coupled to ASIC 11 by flexible connecting wires 43 welded onto corresponding microvias 21 (technique known by the person skilled in the art under the name of "bonding").

Affixing piezoelectric sensor 15 directly on printed circuit board 14 and this technique of "bonding" make it possible to shorten the length of connections in comparison to the assembly with support 8 of conventional ultrasonic transducer 1.

In this way any electromagnetic interference is limited and the EMC (electromagnetic compatibility) behaviour is improved.

An improvement in the electromagnetic compatibility performance also results from embedding some electronic components 11, 12 of the card, particularly ASIC 11, because the two external copper layers 24 of printed circuit board 14 serve as shielding.

Integrated components 28 being coupled by means of copper metallization, electronic card 13 is more robust against impact than a conventional electronic card 5 where all components 7 are welded with tin. Indeed, welding with tin is the most critical failure in respect to the reliability of electronics.

Considering the use of ultrasonic transducer 10 according to the invention in a system to assist parking or emergency braking, i.e. in applications where ultrasonic transducer 10 is fitted in the bumpers of the vehicle, the person skilled in the art must solve problems associated with moisture and water spray or corrosive elements (pollutants).

Their integration in printed circuit board 14 allows the most important active components 11 to be protected against these attacks.

It goes without saying that the invention is not limited to the single preferred embodiment described above.

Notably the type of ultrasonic transducer 15 can be different from a piezoelectric sensor, for example a piezoresistive, magnetostrictive, capacitive or impulse-echo type of sensor, and the circuit board can be different from an ASIC 11, for example it may consist of a microcontroller and a power circuit.

The invention thus embraces all possible alternative implementations, insofar as the features of this ultrasonic transducer 10 do not leave the framework defined by the following claims.

The invention claimed is:

1. Motor vehicle ultrasonic transducer (1, 10) for distance measurement of the type comprising:
    a housing (2, 16) provided with an electrical connector (3, 17);
    at least one ultrasonic transducer (4, 15);
    an electronic card (5, 13) for controlling said ultrasonic transducer (4, 15) arranged inside said housing (2, 16) and consisting of a printed circuit board (6, 14) on which active components (7, 11) and passive components (7, 12) are mounted, wherein said active components (7, 11) include integrated active components (11) completely embedded in a substrate (18) of said printed circuit board (14) and wherein said passive components (7, 12) include integrated passive components (12) completely embedded in said substrate and wherein said active components (7, 11) and said passive components (7, 12) comprise surface-mounted components (7) arranged solely on one side of said printed circuit board (14) and said transducer (15) is mounted on an opposite side.

2. Motor vehicle ultrasonic transducer (10) for distance measurement according to claim 1, wherein said integrated active components (11) and said integrated passive components (12) comprise copper pads (19) connected by microvias (21) to copper tracks (20) of said printed circuit board (14).

3. Motor vehicle ultrasonic transducer (10) for distance measurement according to claim 1, wherein said integrated active components (11) include at least one bare silicon chip (11).

4. Motor vehicle ultrasonic transducer for distance measurement according to claim 3, wherein said chip (11) is an ASIC.

5. Motor vehicle ultrasonic transducer (10) for distance measurement according to claim 1, wherein said ultrasonic transducer (15) consists of a piezoelectric sensor (15).

6. Method of manufacturing the motor vehicle ultrasonic transducer (1, 10) for distance measurement according to claim 1 of the type comprising a general step of producing an electronic card (5, 13) including a printed circuit board (6, 14), and electronic components (7, 11, 12), wherein said general step comprises:
    a preliminary step (17) of pre-treating at least one of said electronic components (7, 11, 12) subsequently forming at least one integrated component (11, 12, 28) embedded in said printed circuit board (14);
    a first step (22) of laser drilling reference marks (23) on copper layers (24) subsequently forming part of said printed circuit board (14);
    a second step (25) of printing at least one of said copper layers (24) with a dielectric material (26);
    a third step (27) of placing said integrated component (28) on said dielectric material (26);
    a fourth step (29) of stacking and pressing said copper layers (24) and organic substrate layers (18) comprising at least one recess (30) to receive said integrated component (11, 12, 28);
    a fifth step (31) of laser drilling;
    a sixth step (33) of mechanical drilling;
    a seventh step (36) of purification;
    an eighth step (37) of metallization to form vias (35) and microvias (21) comprising a first phase (38) of imaging, a second phase (39) of copper deposition and a third phase (40) of stripping and etching;
    a ninth step (41) of automatic inspection;
    a downstream step (42) of treating said organic substrate.

7. Method of manufacturing the motor vehicle ultrasonic transducer (10) for distance measurement according to claim 6, wherein said general step moreover comprises a first additional step of arranging solely on a first side of said printed circuit board (14) at least one of said electronic components (7) of the surface-mounted component type.

8. Method of manufacturing the motor vehicle ultrasonic transducer (10) for distance measurement according to claim 7, wherein said general step moreover comprises a second additional step of affixing at least one piezoelectric sensor (15) on a second side opposite said first side and coupling said piezoelectric sensor (15) to said corresponding microvias (21) by flexible connecting wires (43).

9. Use of the motor vehicle ultrasonic transducer (10) for distance measurement according to claim 1 in a system to assist parking or emergency braking.

10. Motor vehicle ultrasonic transducer (10) for distance measurement according to claim 2, wherein said integrated active components (11) include at least one silicon chip (11).

11. Motor vehicle ultrasonic transducer (10) for distance measurement according to claim 2, wherein said ultrasonic transducer (15) consists of a piezoelectric sensor (15).

12. Motor vehicle ultrasonic transducer (10) for distance measurement according to claim 3, wherein said ultrasonic transducer (15) consists of a piezoelectric sensor (15).

13. Motor vehicle ultrasonic transducer (10) for distance measurement according to claim 4, wherein said ultrasonic transducer (15) consists of a piezoelectric sensor (15).

14. Method of manufacturing the motor vehicle ultrasonic transducer (1, 10) for distance measurement according to claim 2 of the type comprising a general step of producing an electronic card (5, 13) including a printed circuit board (6, 14), and electronic components (7, 11, 12), wherein said general step comprises:
    a preliminary step (17) of pre-treating at least one of said electronic components (7, 11, 12) subsequently forming at least one integrated component (11, 12, 28) embedded in said printed circuit board (14);
    a first step (22) of laser drilling reference marks (23) on copper layers (24) subsequently forming part of said printed circuit board (14);
    a second step (25) of printing at least one of said copper layers (24) with a dielectric material (26);
    a third step (27) of placing said integrated component (28) on said dielectric material (26);
    a fourth step (29) of stacking and pressing said copper layers (24) and organic substrate layers (18) comprising at least one recess (30) to receive said integrated component (11, 12, 28);
    a fifth step (31) of laser drilling;
    a sixth step (33) of mechanical drilling;
    a seventh step (36) of purification;
    an eighth step (37) of metallization to form vias (35) and microvias (21) comprising a first phase (38) of imaging, a second phase (39) of copper deposition and a third phase (40) of stripping and etching;
    a ninth step (41) of automatic inspection;
    a downstream step (42) of treating said organic substrate.

15. Method of manufacturing the motor vehicle ultrasonic transducer (1, 10) for distance measurement according to claim 3 of the type comprising a general step of producing an electronic card (5, 13) including a printed circuit board (6, 14), and electronic components (7, 11, 12), wherein said general step comprises:
    a preliminary step (17) of pre-treating at least one of said electronic components (7, 11, 12) subsequently forming at least one integrated component (11, 12, 28) embedded in said printed circuit board (14);
    a first step (22) of laser drilling reference marks (23) on copper layers (24) subsequently forming part of said printed circuit board (14);
    a second step (25) of printing at least one of said copper layers (24) with a dielectric material (26);
    a third step (27) of placing said integrated component (28) on said dielectric material (26);
    a fourth step (29) of stacking and pressing said copper layers (24) and organic substrate layers (18) comprising at least one recess (30) to receive said integrated component (11, 12, 28);
    a fifth step (31) of laser drilling;
    a sixth step (33) of mechanical drilling;
    a seventh step (36) of purification;
    an eighth step (37) of metallization to form vias (35) and microvias (21) comprising a first phase (38) of imaging, a second phase (39) of copper deposition and a third phase (40) of stripping and etching;
    a ninth step (41) of automatic inspection;
    a downstream step (42) of treating said organic substrate.

16. Method of manufacturing the motor vehicle ultrasonic transducer (1, 10) for distance measurement according to claim 4 of the type comprising a general step of producing an electronic card (5, 13) including a printed circuit board (6, 14), and electronic components (7, 11, 12), wherein said general step comprises:
    a preliminary step (17) of pre-treating at least one of said electronic components (7, 11, 12) subsequently forming at least one integrated component (11, 12, 28) embedded in said printed circuit board (14);
    a first step (22) of laser drilling reference marks (23) on copper layers (24) subsequently forming part of said printed circuit board (14);
    a second step (25) of printing at least one of said copper layers (24) with a dielectric material (26);
    a third step (27) of placing said integrated component (28) on said dielectric material (26);
    a fourth step (29) of stacking and pressing said copper layers (24) and organic substrate layers (18) comprising at least one recess (30) to receive said integrated component (11, 12, 28);
    a fifth step (31) of laser drilling;
    a sixth step (33) of mechanical drilling;
    a seventh step (36) of purification;
    an eighth step (37) of metallization to form vias (35) and microvias (21) comprising a first phase (38) of imaging, a second phase (39) of copper deposition and a third phase (40) of stripping and etching;
    a ninth step (41) of automatic inspection;
    a downstream step (42) of treating said organic substrate.

17. Method of manufacturing the motor vehicle ultrasonic transducer (1, 10) for distance measurement according to claim 5 of the type comprising a general step of producing an electronic card (5, 13) including a printed circuit board (6, 14), and electronic components (7, 11, 12), wherein said general step comprises:
    a preliminary step (17) of pre-treating at least one of said electronic components (7, 11, 12) subsequently forming at least one integrated component (11, 12, 28) embedded in said printed circuit board (14);
    a first step (22) of laser drilling reference marks (23) on copper layers (24) subsequently forming part of said printed circuit board (14);
    a second step (25) of printing at least one of said copper layers (24) with a dielectric material (26);
    a third step (27) of placing said integrated component (28) on said dielectric material (26);
    a fourth step (29) of stacking and pressing said copper layers (24) and organic substrate layers (18) comprising at least one recess (30) to receive said integrated component (11, 12, 28);
    a fifth step (31) of laser drilling;
    a sixth step (33) of mechanical drilling;
    a seventh step (36) of purification;
    an eighth step (37) of metallization to form vias (35) and microvias (21) comprising a first phase (38) of imaging, a second phase (39) of copper deposition and a third phase (40) of stripping and etching;
    a ninth step (41) of automatic inspection;
    a downstream step (42) of treating said organic substrate.

* * * * *